United States Patent [19]

Huang et al.

[11] Patent Number: 5,790,611
[45] Date of Patent: Aug. 4, 1998

[54] METHOD AND APPARATUS FOR ADJUSTING THE PHASE OF A DIGITAL SIGNAL

[75] Inventors: Jen-Hsun Huang, San Jose; Stony Peng, Fremont, both of Calif.

[73] Assignee: LSI Logic Corporation, Milpitas, Calif.

[21] Appl. No.: 289,886

[22] Filed: Aug. 12, 1994

[51] Int. Cl.⁶ .............................. H04L 7/00; H04L 25/36; H04L 25/40

[52] U.S. Cl. .............................. 375/371; 327/161

[58] Field of Search .................... 375/371, 373, 375/376; 370/108; 371/1; 327/141, 152, 153, 162, 163, 155, 156, 161; 331/18, 25

[56] References Cited

U.S. PATENT DOCUMENTS

| | | | |
|---|---|---|---|
| 5,022,056 | 6/1991 | Henderson et al. | 375/373 |
| 5,313,501 | 5/1994 | Thacker | 375/371 |
| 5,488,641 | 1/1996 | Ozhan | 375/376 |

*Primary Examiner*—Stephen Chin
*Assistant Examiner*—Hai H. Phan
*Attorney, Agent, or Firm*—Katz & Cotton, L.L.P.

[57] ABSTRACT

A method and apparatus for improving the phase granularity when changing the phase of a digital signal. The present invention doubles the phase shift granularity of a phase shifting system by either adding or not adding one-half unit of phase delay to the digital signal being phase shifted. When increasing phase delay is being added to the digital signal, no additional phase delay is added to the digital signal. When decreasing phase delay is being adding to the digital signal, one-half unit of phase delay is added to the digital signal. Thus, whenever a change is made between increasing or decreasing phase delay, a one-half unit phase delay is introduced which effectively doubles the phase delay granularity of the phase delay system at the point of phase delay reversal.

12 Claims, 2 Drawing Sheets

METHOD AND APPARATUS FOR ADJUSTING THE PHASE OF A DIGITAL SIGNAL

BACKGROUND OF THE INVENTION

1. Field of the Invention

The present invention relates to digital systems and, more particularly, to a method and apparatus for incrementally adjusting the phase of a digital signal.

2. Description of the Related Technology

Computers and other digital electronic products are generally comprised of semiconductor integrated circuits. Present technology integrated circuits may contain millions of transistors and be configured, for example, as a central processing unit (CPU), arithmetic logic unit (ALU), random access memory (RAM), programmable logic array (PLA), application specific integrated circuit (ASIC), or digital signal processor (DSP). Both sophistication and speed of operation of these integrated circuits has rapidly increased because of improvements in integrated circuit manufacturing technologies resulting in smaller and faster devices.

Digital systems, comprised of these semiconductor integrated circuits, have digital signals such as clock signals to process data, control circuit timing and setup, and for data communication synchronization. A clock signal has a period waveform, and normally has a constant frequency. Clock signals or "clocks" may be used throughout a digital system comprised of a plurality of integrated circuits. A single very large scale integrated circuit ("VLSI") may have multiple clock circuits that drive various circuits therein. These multiple clock circuits may be used for ease in clock signal distribution within the integrated circuit, or for specific circuit functions requiring isolated or controllable clock signals.

Clock distribution within an integrated circuit requires precise phase correlation. This is to insure that there is proper setup and processing of the digital information within the integrated circuit. The timing requirements of multiple integrated circuits of a digital system also require equally precise phase correlation. Reliable operation of the integrated circuit depends upon data being stable when a clock signal is received. If a clock signal is out of phase, then the data may no longer be valid. This is also true when transferring signals between multiple integrated circuits.

Digital signals propagate through a plurality of combinatorial gate logic, shift registers, storage registers, transmission mediums, and encounter other propagation delays due to circuit capacitance, inductance and signal path distances within or between integrated circuits. All electronic circuits have resistance, inductance and capacitance inherent within the physical structure of the electronic circuit. Integrated circuit devices have predominately resistance and capacitance. The resistance ("R") and capacitance ("C") create an RC time constant delay to a fast rising edge square wave, such as a clock signal. When clock signal delays are different between different areas of the integrated circuit, then the difference between the signal delays or phase difference is called "skew".

Differences in clock signal delays are usually caused by differences in capacitance associated with the different circuit loads requiring the clock signal. Reliable operation of complex electronic circuits within an integrated circuit depend upon data being stable when a clock signal is received. Clock skew within an integrated circuit was not a major problem until the speed of integrated circuits increased dramatically. Similarly, data transmission between these faster integrated circuits requires precise clock timing and minimal skew.

Digital clock signals have repetitive waveforms and are thus cyclical. Each cycle of a clock signal may be divided into 360 degrees. The phase difference or skew between two clock signals having the same frequency may be expressed in degrees. When there is 0 degree phase difference between the clock signals, these clock signals are said to be "in phase".

In data communication demodulation, data and clock signals may be 90 degrees "out of phase" when utilizing quadrature phase detection. Phase alignment of received data with a predefined correlation word requires phase adjustment of the two signals to minimize skew and to properly "lock" together the two signals either in phase or at a 90 degree phase difference for quadrature detection.

Digital phase lock loops ("DPLL") are utilized with ASIC state machines in both communications and computer applications. The DPLL comprises a series of delay elements that are selectable. A received digital signal is compared against a reference clock signal. The phase deference between the signals is determined by a phase detector of the DPLL and the appropriate amount of delay is added to the digital signal until the phase deference between signals is minimal or substantially 90 degrees, depending on the application. The DPLL does not change the received digital signal, it only delays the signal by a discrete amount.

Precise control of the phase delay of digital signals in a digital system such as a DPLL requires a plurality of digital phase delay circuits. The number of delay circuits required depends on the phase granularity required in the system. For example, one degree phase increments requires utilizing 359 different delay circuits. These delay circuits may be configured into coarse and fine phase delay steps where the coarse steps are made in one delay circuit and fine steps between each coarse step are made in another delay circuit.

Utilizing coarse and fine dual delay circuits, each having a plurality of selectable delay times, results in a great deal of circuitry and may require complex control algorithms for proper operation. What is needed is a method and apparatus which uses a minimum number of delay circuits to achieve sufficient phase granularity without requiring complex control algorithms. It is therefore an object of the present invention to double the phase shifting granularity capabilities of a phase delay circuit having multiple taps, and that is easily fabricated in a semiconductor integrated circuit die.

SUMMARY OF THE INVENTION

The present invention provides a method and apparatus for doubling the phase shifting granularity capabilities of a digital system such as, for example a DPLL. The present invention accomplishes this by utilizing a flopper circuit that adds or subtracts one-half of the normal unit delay time to or from the delay circuit.

In an embodiment of the present invention, when one unit of delay is subtracted from the delay circuit, the flopper circuit adds one-half unit of delay. Conversely, when one unit of delay is added to the delay circuit, the flopper circuit removes the added one-half unit of delay. In this way, the delay step granularity is doubled without introducing non-linearities as would be the case when switching between fine and coarse delay circuits.

The present invention accomplishes this doubling of delay granularity by utilizing only one delay element and a multiplexer switch in conjunction with state machine logic. The delay element of the flopper circuit is chosen to introduce "one-half-unit-delay" time or "no-delay time", selectable by the multiplexer switch. The half delay time of the flopper is selected when the delay circuit is reduced by one unit time. This effectively adds one-half-unit-delay time, thus, the resulting delay to the digital signal being delayed is reduced by one-half-unit-delay time.

When the unit delay time is increased by one unit, the flopper no-delay time is selected which effectively subtracts one-half unit of delay time, thus, resulting in a net increase of one-half unit of delay time. The flopper multiplexer switch may independently select between the no delay and half delay times for precise tuning of the DPLL.

In one aspect of the invention, the flopper circuit is controlled by state machine logic that also controls the multiple time delay tap circuit. The state machine logic receives phase error information from a digital phase detector. The phase error information received is the phase error magnitude and direction, i.e., whether delay must be added to or subtracted from the incoming digital signal. The state machine logic determines which direction the digital signal must move in the phase/time coordinate. The state machine logic then controls selection of the appropriate delay tap of the time delay circuit and the multiplexer switch position of the flopper circuit.

For example, the phase detector determines that the digital signal must be delayed in time to reduce the phase error between the digital signal and reference clock. The state machine logic selects the flopper no-delay and begins to increase the time delay one unit delay at a time. The phase error between the signals steadily decreases until the digital signal is delayed in time more than is necessary. The phase detector now signals the state machine logic to reduce the time delay of the digital signal. The state machine logic reduces the time delay one unit but also selects the flopper circuit one-half-unit-delay which effectively results in a reduction of only one-half unit time delay of the digital signal. Thus, the phase/time shifting granularity has been doubled without requiring separate coarse and fine delay circuits.

On the other hand, when the digital signal is delayed too much, the phase detector instructs the state machine logic to reduce the time delay of the digital signal. The flopper circuit multiplexer switch presently is selecting the one-half-unit-delay of the flopper and remains in this position as the state machine logic reduces the unit time delay one unit at a time. As soon as the phase detector determines that the digital signal is no longer delayed too much, but rather needs to be delayed in time, the state machine logic causes one unit of time delay to be added and switches the flopper multiplexer switch from one-half-unit-delay to no-delay. Thus, effectively only one-half unit of time delay is added to the digital signal. In this way, time delay may be added at one-half the unit time of the delay circuit, effectively doubling the phase shift granularity of the DPLL. This aids in acquiring synchronization between the digital signal and the reference clock without undue phase shift hunting which may be the case with a coarser phase shift granularity.

An advantage of the present invention is in utilizing only one time delay chain in conjunction with state machine logic and the flopper circuit to give twice the phase shift resolution of the time delay chain.

Another advantage is automatically selecting a half step time delay when reversing the time delay increments added to or subtracted from a digital signal.

Still another advantage is that the present invention utilizes substantially standard logic gates and delay circuits to implement the multiplexing of the no-delay and one-half-unit-delay selection.

A feature of the present invention is utilizing a multiplexed one-half-unit-delay to double the phase shift tuning granularity of a digital phase lock loop.

Another feature is utilizing standard integrated circuit transistor cells and metal loading for the one-half-unit-delay.

Other and further objects, features and advantages will be apparent from the following description of a presently preferred embodiment of the invention, given for the purpose of disclosure and taken in conjunction with the accompanying drawings.

DESCRIPTION OF A PREFERRED EMBODIMENT

Figure 1:
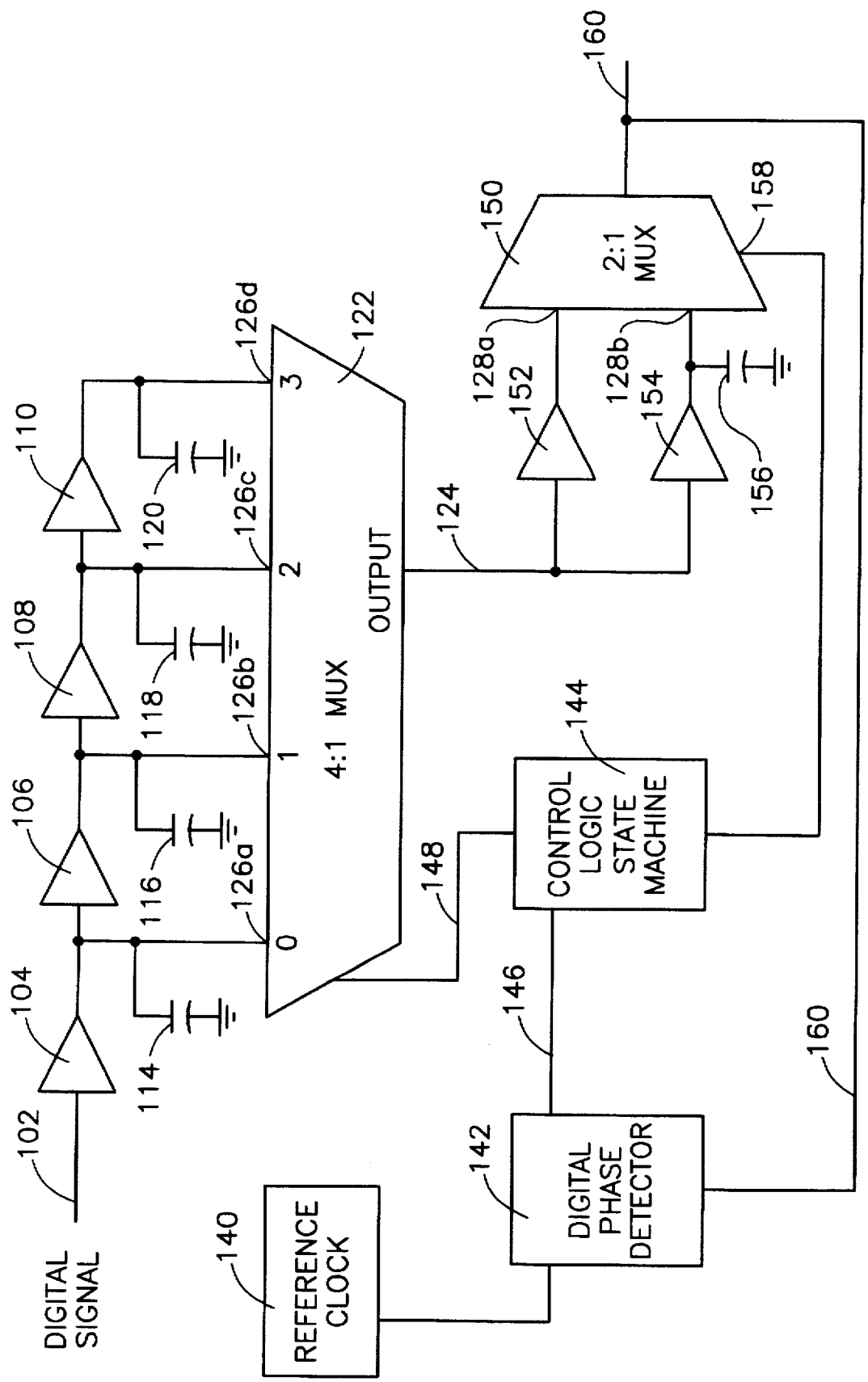
FIG. 1 is a schematic block diagram of a digital phase lock loop utilizing an embodiment of the present invention.

Referring now to the drawings, the details of a preferred embodiment are schematically illustrated. Like elements are numbered the same, and similar elements are represented by the same number and a different lower case letter suffix. Referring now to FIG. 1, a block diagram of a digital phase lock loop system including an embodiment of the present invention is illustrated. The digital phase lock loop system consists of a reference clock 140, a digital phase detector 142, and a selectable delay circuit consisting of buffer amplifiers 104, 106, 108 and 110; capacitors 114, 116, 118 and 120, and multiplexer 122. The present invention is part of the digital phase lock loop system and comprises buffer amplifiers 152 and 154, capacitor 156, multiplexer 150, and control logic 144.

A digital signal 102 is applied to the input of the buffer amplifier 104. Buffer amplifier 104 and capacitor 114 form a first delay unit that delays the digital signal 102 a predetermined amount of time, hereinafter referred to as "one unit delay". Amplifier 106 and capacitor 116 form a second delay unit that also delays the digital signal 102 one unit delay. Similarly, buffer amplifiers 108 and 110, and capacitors 118 and 120 form third and fourth delay units, respectively. Thus, as digital signal 102 passes through buffer amplifiers 104, 106, 108 and 110 the digital signal 102 is delayed one, two, three or four unit delays, respectively. Four unit delays are illustrated for illustrative purposes, but one skilled in the art of digital delay lines will readily appreciate the ease in implementing more or fewer unit delays for digital signal 102.

The multiplexer 122 has four selectable inputs 126a–d connected to the outputs of the buffer amplifiers 104–110, respectively. The multiplexer 122 connects one of the four inputs 126a–d to output 124 based on a control signal 148 from the control logic 144. The control signal 148 is used to select unit delays of from one to four. The output 124 of the multiplexer 122 is applied to buffer amplifiers 152 and 154. The buffer amplifier 152 has substantially no delay and the combination of buffer amplifier 154 and capacitor 156 results in a one-half-unit-delay at the output of the buffer amplifier 154.

The multiplexer 150 selects the undelayed output of buffer amplifier 152, or the one-half-unit-delayed output of buffer amplifier 154 and applies the selection as an output signal 160. Control signal 158 from the control logic 144 determines this selection. The output signal 160 is connected to an input of the digital phase detector 142. The digital phase detector 142 compares the phase difference between the output signal 160 and the reference clock 140. Depending on the phase difference between the reference clock 140 and the output signal 160, a signal 146 instructs the control logic 144 to either add or subtract time delay from the digital signal 102.

When the digital signal 102 is leading in phase in relation to the reference clock 140, time delay must be added to the digital signal 102 to bring both signals in phase. On the other hand, when the digital signal 102 is lagging in phase in reference to the reference clock 140, time delay must be subtracted from the digital signal 102 to bring both signals in phase. Normally, the digital phase lock loop system is adjusted so that an ideally phased digital signal 102 will be properly in phase with the reference clock 140 at approximately the-mid range of the selectable multiples of unit delay. Thus, the system has leeway to add or subtract delay time to or from the digital signal 102.

Figure 2:
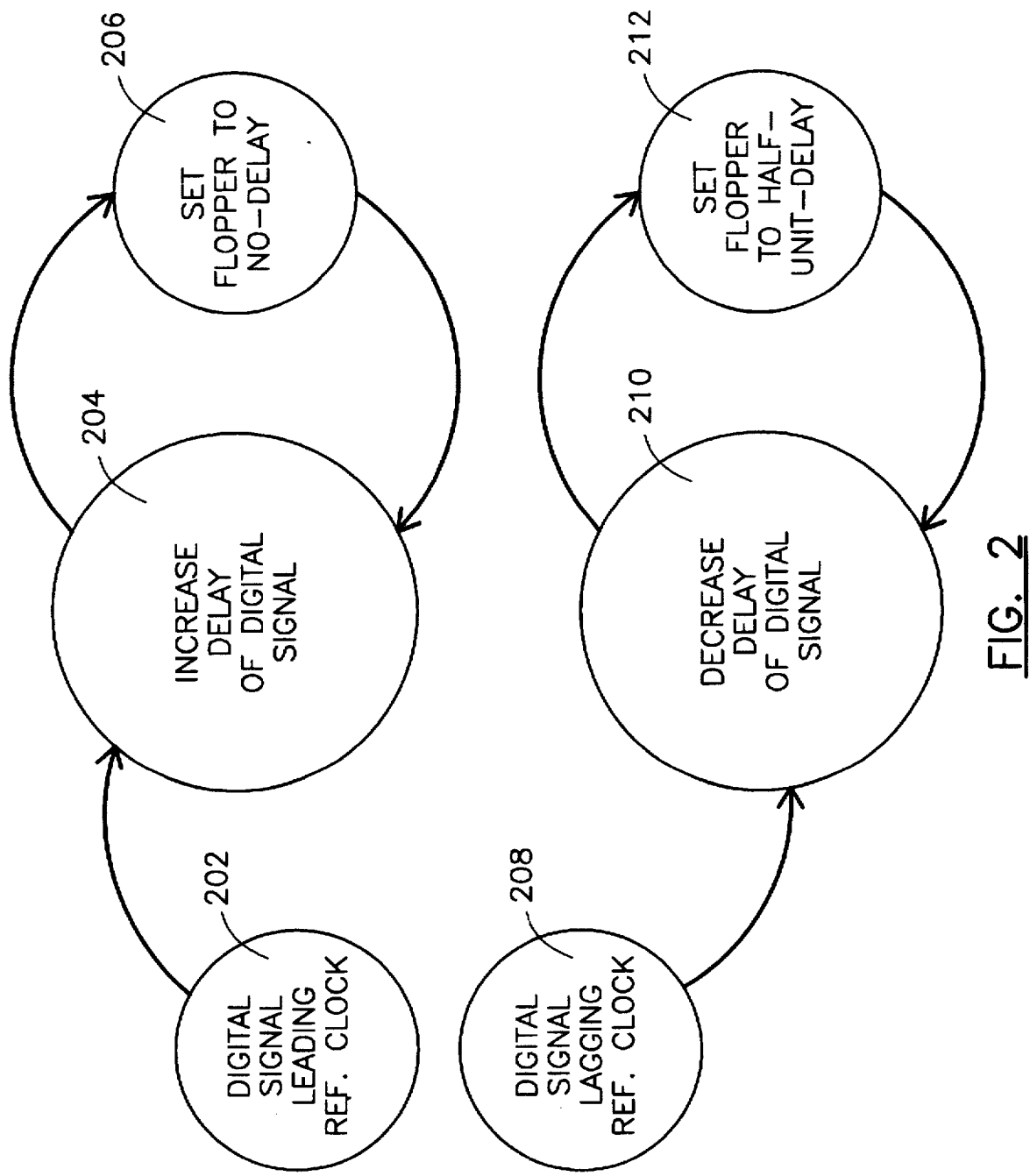
FIG. 2 is a schematic state diagram of the embodiment of FIG. 1.

Referring now to FIG. 2, a schematic state diagram of a preferred embodiment of the present invention is illustrated. The present invention is a method and apparatus for doubling the granularity or resolution of time delay applied to the digital signal 102. When control signal 146 from the digital phase detector 142 indicates that the digital signal 102 is leading the reference clock 140, the control logic counts up a binary number on control signal 148 which progressively selects a longer delay input tap of the multiplexer 122. For example, a binary 10 on control signal 148 will select input 126c and the digital signal 102 will be delayed by three delay units at output 124. This is represented by state diagram steps 202 and 204.

The control signal 158 from control logic 144 sets the multiplexer 150 to input 128a which has substantially no delay from the buffer amplifier 152. This is represented by state diagram step 206. Therefore, as the multiplexer 122 selects increasing time delays, the present invention introduces substantially no delay. Eventually, the digital signal 102 will be overcompensated, i.e., delayed too much and the digital phase detector 142 will then instruct the control logic 144 to reduce the amount of time delay to the digital signal 102.

Upon being instructed to reduce the amount of time delay to the digital signal 102, the control logic 144 starts counting down which causes the control signal 148 to successively select lower delay taps, i.e., inputs 126c, 126b, or 126a. Reduction of delay time is represented in the state diagram steps 208 and 210. The control signal 158 from control logic 144 now sets the multiplexer 150 to input 128b which is adapted to have one-half-unit-delay from the combination of buffer amplifier 154 and capacitor 156. This is represented by state diagram step 212. Therefore, as the multiplexer 122 selects decreasing time delays, the present invention introduces one-half-unit-delay. This effectively produces a one-half-unit-delay reduction in the digital signal 102. Thus, the time step resolution is doubled, i.e., the first time step reversal is at one-half unit instead of one-unit.

All subsequent time step reductions are in one unit time steps until the digital phase detector 142 indicates that the digital signal 102 is again leading the reference clock 140. At this point, the control logic 144 begins counting up, thus increasing the unit time by selecting increasing unit delay inputs 126 of the multiplexer 122. During the first unit delay increase, the control signal 158 from the control logic 144 causes the multiplexer 150 to switch from input 128b to input 128a. The one-half-unit-delay present when decreasing the unit time steps is removed, effectively causing the first step time increase to be only one-half-unit-delay. The resulting one-half-unit-delay gives a finer tuning resolution when phase locking the digital signal 102 and reference clock 140. This is represented by state diagram steps 204 and 206.

The method and apparatus of the present invention is utilized when either increasing or decreasing the time delay of the digital signal 102 during correction of a leading or lagging phase relationship, respectively, with the reference clock 140. The phase (time delay) correction is performed in one unit delay step increments until the system has overcompensated the phase correction of the digital signal 102. When a phase correction overcompensation is detected, the delay increment must be reversed, i.e., from increasing to decreasing or vise versa. Upon the reversal in delay step increment, the present invention causes the first delay increment to be one-half-unit-delay, while subsequent increments in the same delay direction are one unit delay each. It is especially important to use a finer delay step when correcting from over compensation of the digital signal 102. This allows quicker and more accurate phase locking. The present invention accomplishes finer phase compensation at a point where it is most needed, at the point of overcompensation, without complex and costly additional multiple delay line circuits.

The present invention, therefore, is well adapted to carry out the objects and attain the ends and advantages mentioned, as well as others inherent therein. While a presently preferred embodiment of the invention and various aspects thereto has been given for purposes of disclosure, numerous changes in the details of construction, interconnection and arrangement of parts will readily suggest themselves to those skilled in the art and which are encompassed within the spirit of the invention and the scope of the appended claims.

What is claimed is:

1. A method for adjusting the phase of a digital signal, comprising the steps of:

delaying a digital signal in time by a plurality of selectable time delay intervals, each interval having a predefined time;

determining the phase difference between the digital signal and a reference clock;

increasing the amount of time delay of the digital signal when the digital signal is leading in phase with respect to said reference clock;

decreasing the amount of time delay of the digital signal when the digital signal is lagging in phase with respect to said reference clock;

adding a time delay interval of approximately one-half of the predefined time to the digital signal when changing from increasing time delay to decreasing time delay of the digital signal; and adding substantially no additional time delay to the digital signal when changing from decreasing time delay to increasing time delay of the digital signal.

2. The method of claim 1, wherein the step of delaying the digital signal comprises the step of delaying the digital signal in a digital delay line having a plurality of selectable delay taps, each tap having a time delay interval of approximately said predefined time.

3. The method of claim 2, wherein the step of increasing the amount of time delay of the digital signal comprises the step of selecting respectively increasing delay taps of the digital delay line.

4. The method of claim 2, wherein the step of decreasing the amount of time delay of the digital signal comprises the step of selecting respectively decreasing delay taps of the digital delay line.

5. The method of claim 2, after the step of determining the phase difference between the digital signal and the reference clock, further comprising the step of selecting respective delay taps of the digital delay line such that the phase difference between the digital signal and the reference clock is minimized.

6. A system for adjusting the phase of a digital signal comprising:

means for delaying a digital signal in time by a plurality of selectable time delay intervals, each interval having a predefined time;

means for determining the phase difference between the digital signal and a reference clock;

means for increasing the amount of time delay of the digital signal when the digital signal is leading in phase with respect to said reference clock;

means for decreasing the amount of time delay of the digital signal when the digital signal is lagging in phase with respect to said reference clock;

means for adding a time delay interval of approximately one-half of the predefined time to the digital signal when changing from increasing time delay to decreasing time delay of the digital signal; and means for adding substantially no additional time delay to the digital signal when changing from decreasing time delay to increasing time delay of the digital signal.

7. The system of claim 6, wherein the means for delaying the digital signal is a digital delay line having a plurality of selectable delay taps, each tap having a time delay interval of approximately said predefined time.

8. The system of claim 7, wherein the means for increasing the amount of time delay of the digital signal comprises logic for selecting respectively increasing delay taps of said digital delay line.

9. The system of claim 7, wherein the means for decreasing the amount of time delay of the digital signal comprises logic for selecting respectively decreasing delay taps of said digital delay line.

10. The system of claim 6, wherein the means for determining the phase difference is a digital phase detector.

11. The system of claim 6, further comprising a selector circuit for selecting between the means for adding the time delay interval of approximately one-half of the predefined time or means for adding substantially no additional time delay to the digital signal.

12. An apparatus for adjusting the phase of a digital signal, comprising:

a digital delay line having a plurality of selectable delay taps with predefined time delay intervals, said digital delay line adapted to receive the digital signal and output a delayed version of the digital signal;

a digital phase detector having reference and signal inputs and an output, said digital phase detector output indicating relative phase difference between the reference and signal inputs;

a reference clock, said reference clock connected to the reference input of said digital phase detector;

a half delay circuit for delaying the digital signal approximately half the delay time of the predetermined time delay interval of said digital delay line;

said half delay circuit having a control input used to select whether the digital signal is delayed by half a time interval or substantially no delay;

said half delay circuit connected between the output of said digital delay line and the signal input of said digital phase detector; and a logic control circuit having a control input connected to the output of said digital phase detector, a first output connected to said digital delay line for controlling selection of a delay tap, and a second output connected to the control input of said half delay circuit for controlling whether the digital signal is delayed by half a time interval or substantially no delay;

wherein said logic control circuit instructs said half delay circuit to add approximately half the delay time to the digital signal when selecting decreasing time delay taps of said digital delay line, and said logic control circuit instructs said half delay circuit to add substantially no delay to the digital signal when selecting increasing time delay taps of said digital delay line.

* * * * *